United States Patent [19]

Del Tufo et al.

[11] Patent Number: 4,632,594
[45] Date of Patent: Dec. 30, 1986

[54] COUPLING APPARATUS

[75] Inventors: Mark J. Del Tufo, Basking Ridge; George J. Nagle, Phillipsburg, both of N.J.

[73] Assignee: Burroughs Corporation, Detroit, Mich.

[21] Appl. No.: 748,193

[22] Filed: Jun. 24, 1985

[51] Int. Cl.4 .................. F16B 21/00; H01R 13/62
[52] U.S. Cl. ........................... 403/322; 403/348; 403/405.1; 403/407.1; 312/111; 339/91 R; 339/75 M; 220/23.4; 206/821
[58] Field of Search .............. 403/6, 9, 321, 322, 403/407.1, 405.1, 348, 349; 312/111, 107, 198; 220/23.4, 300, 297, 293; 206/821; 339/75 M, 91 R; 464/177, 901

[56] References Cited

U.S. PATENT DOCUMENTS

| | | | |
|---|---|---|---|
| 1,803,847 | 5/1931 | Ellis | 220/297 |
| 1,914,780 | 6/1933 | Lichamer | |
| 2,581,816 | 1/1952 | Schlueter | 403/407.1 X |
| 3,339,954 | 9/1967 | Alvden | 403/322 |
| 3,473,649 | 10/1969 | Posso | 220/300 X |
| 3,633,151 | 1/1972 | Sensabaugh | 339/91 R X |
| 4,097,166 | 6/1978 | Stava | 403/321 |
| 4,103,511 | 8/1978 | Kress et al. | 403/349 X |
| 4,165,908 | 8/1979 | Cooper et al. | 312/111 |
| 4,198,040 | 4/1980 | Colasent | 220/300 X |
| 4,333,580 | 6/1982 | Sweigart, Jr. | 220/330 X |
| 4,439,971 | 4/1984 | Rutherford | 403/321 X |
| 4,466,551 | 8/1984 | Leung | 220/293 |
| 4,501,460 | 2/1985 | Sisler | 339/91 R |
| 4,558,914 | 12/1985 | Prager et al. | 339/91 R X |

FOREIGN PATENT DOCUMENTS

| | | | |
|---|---|---|---|
| 1188285 | 4/1970 | United Kingdom | 220/23.4 |
| 2138221 | 10/1984 | United Kingdom | 339/91 R |

Primary Examiner—Richard J. Scanlan
Assistant Examiner—Todd G. Williams
Attorney, Agent, or Firm—Mark T. Starr; Kevin R. Peterson

[57] ABSTRACT

Means for coupling together two assemblies wherein the first assembly has an end wall formed by a first apertured plate, and the second assembly includes an end wall to which is secured a rotatable end plate. The rotatable end plate carries clamping means which can engage and clamp to apertures in the first apertured plate of the first assembly, whereby the two assemblies are coupled together. In using the apparatus, the two assemblies are positioned adjacent to each other with the rotatable plate and first apertured plate in alignment and the clamping means on the rotatable plate engaging apertures in the first apertured plate. Rotation of the rotatable plate then locks the assemblies together.

23 Claims, 8 Drawing Figures

COUPLING APPARATUS

BACKGROUND OF THE INVENTION

Many types of equipment, for example, electronic apparatus such as computers, comprise a plurality of modules which are mechanically coupled together. Various coupling arrangements suitable for this type of assembly are known; however, the present invention provides a particularly effective coupling arrangement which is easy to operate and which, incidentally, may be interrelated with locking means for preventing theft of one or more coupled modules.

DESCRIPTION OF THE INVENTION

Figure 1:
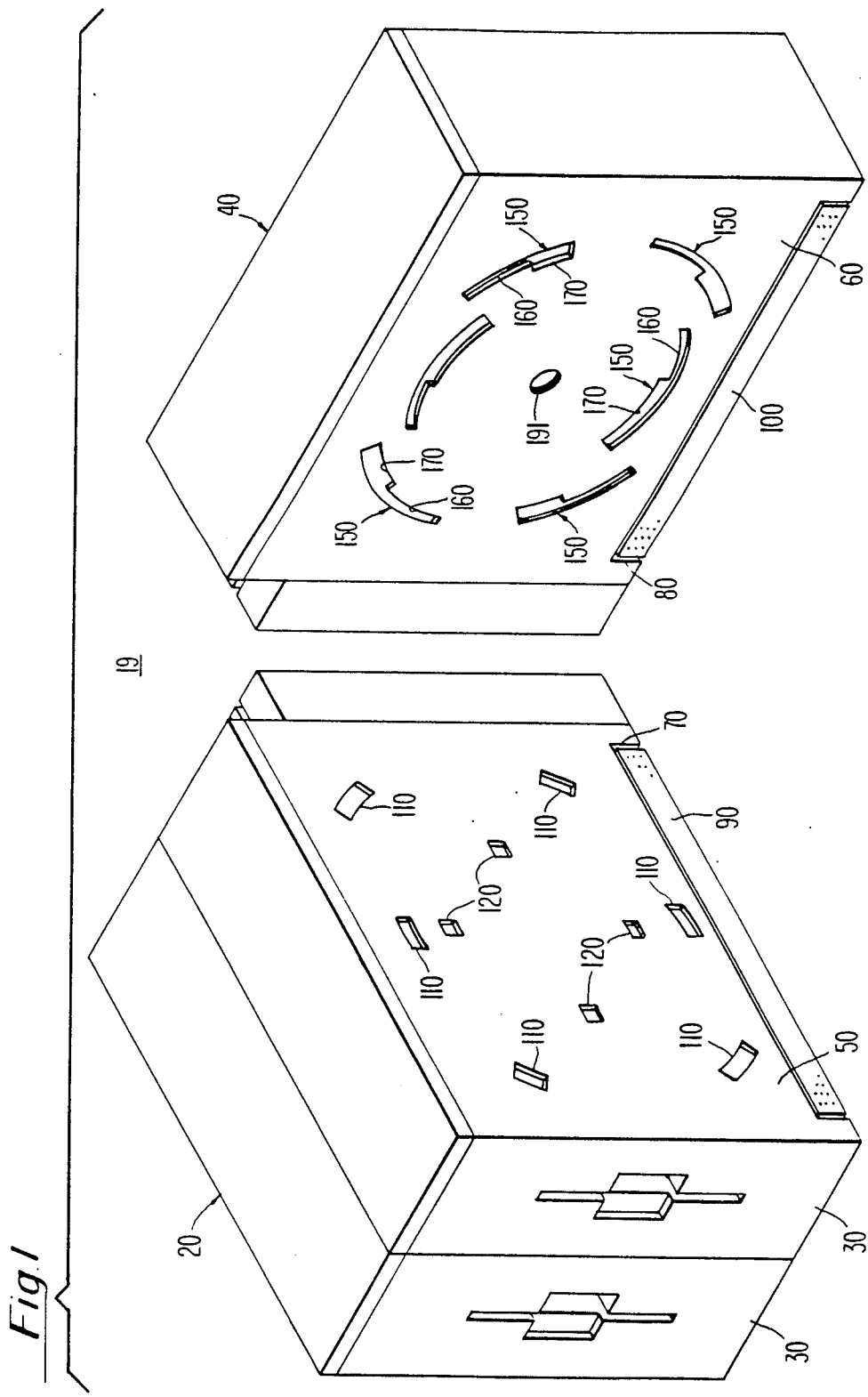
FIG. 1 is a perspective view of portions of the invention shown as separated modules.

The principles of the invention are described with respect to electronic apparatus such as disk drive modules and means for coupling together component parts thereof, but their applicability to other types of apparatus which must be coupled together will be apparent to those skilled in the art.

A portion of the disk drive assembly 19 comprises a first assembly 20 made up of one or more disk drives 30 and a second assembly 40 which may also comprise a disk drive or some other apparatus. The first assembly 20 includes one end wall formed by a metal plate 50, and the second assembly 40 similarly includes an end wall formed by a metal plate 60. The lower edge of each plate 50, 60 is cut out to provide a space 70, 80, respectively, in which multi-pin sockets 90 and 100 are seated and electrically connected to printed circuit boards or other apparatus inside the two assemblies 20, 40. Plate 50 is provided with an array of curved openings 110 on a first outer circumference and an array of second smaller inner openings 120 on a smaller circumference.

The plate 60 is provided with an array of curved openings 150 which are made up of first portions 160 of the same width and second portions 170 of somewhat greater width.

The apparatus of the invention includes a coupling plate 180 for coupling together the two assemblies 20 and 40. The plate 180 is provided on its rear surface with a plurality of curved brackets 190 which are known as retention tabs and are positioned and sized so that they can enter the curved openings 150 in plate 60. The retention tabs 190 initially engage in the openings 170 and ride in the openings 160 during operation.

Means including retaining rings and the like are provided to rotatably couple the coupling plate 180 to the plate 60 at about their centers 191 and 193 with the retention tabs 190 in the openings 150, the openings 150 being of sufficient length so that the retention tabs 190 can ride in them as the coupling plate 180 is pivoted in operation.

The front surface of the coupling plate 180 is provided with a plurality of locking ramps 200 arrayed on a first circumference to match the openings 110 in plate 50. The ramps 200 comprise brackets which are secured to the plate 180 at one end 202 and include a first portion 204 which lies generally parallel to but spaced from the plate 180 and an end portion 206 which tapers outwardly away from the main body of the plate 180.

Figure 4:
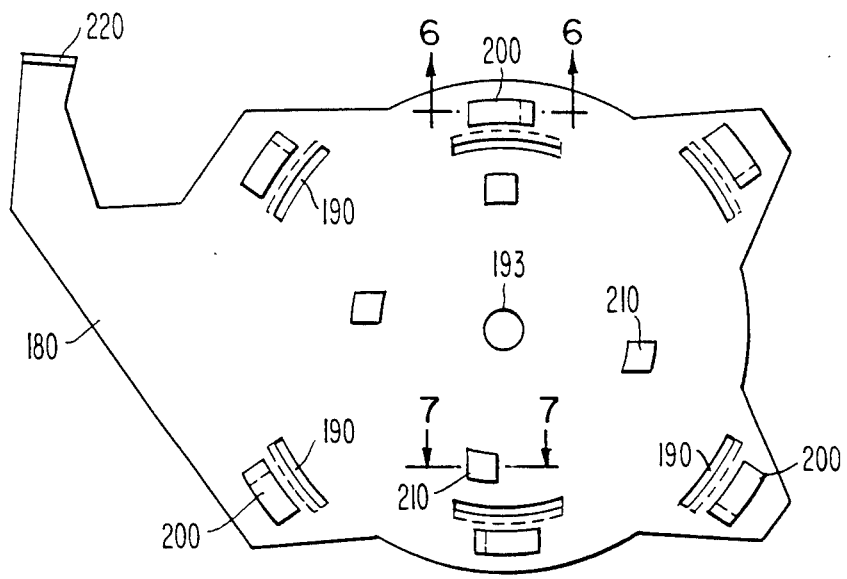
FIG. 4 is a front view of the coupling plate of FIGS. 2 and 3.
Figure 5:
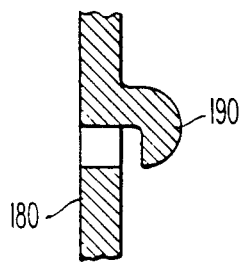
FIG. 5 is a sectional view along the lines 5—5 in FIG. 3.
Figure 6:
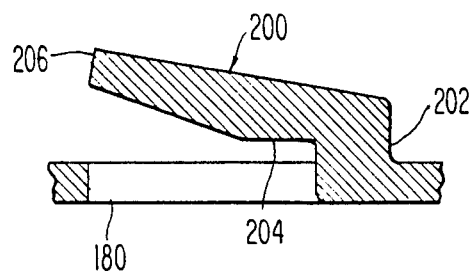
FIG. 6 is a sectional view along the lines 6—6 in FIG. 4.
Figure 7:
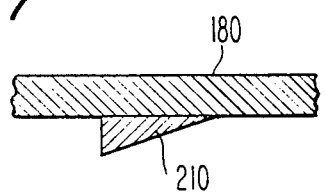
FIG. 7 is a sectional view along the lines 7—7 in FIG. 4.

A plurality of small wedge-shaped members 210, (FIGS. 2 and 4) known as ejection wedges, are formed on the front surface of the coupling plate 180 and positioned to align with the apertures 120 in plate 50.

The coupling plate is provided with a projecting portion 220 which is used as a handle.

Figure 2:
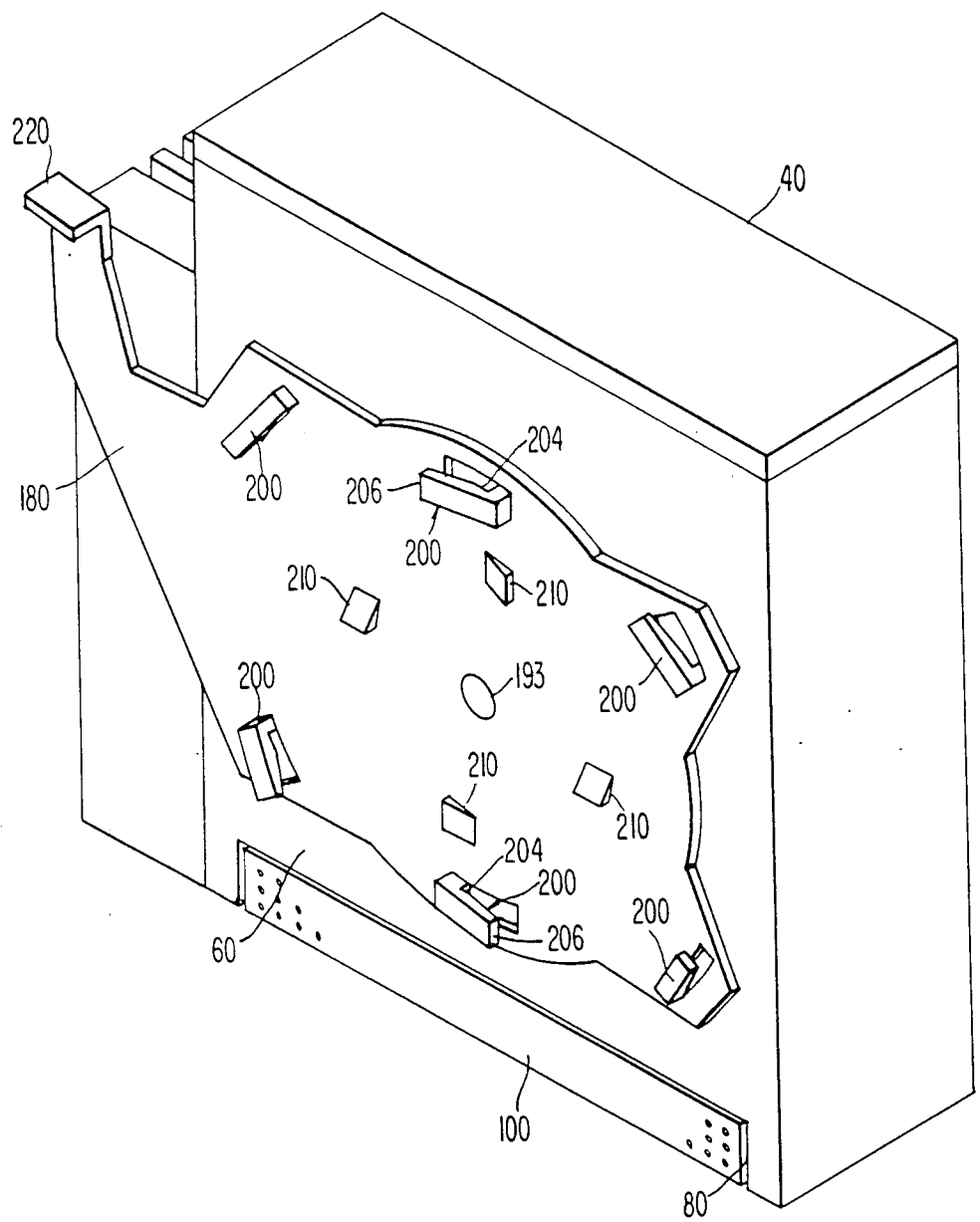
FIG. 2 is a perspective view of one portion of the apparatus of FIG. 1 with a coupling plate secured to it.
Figure 3:
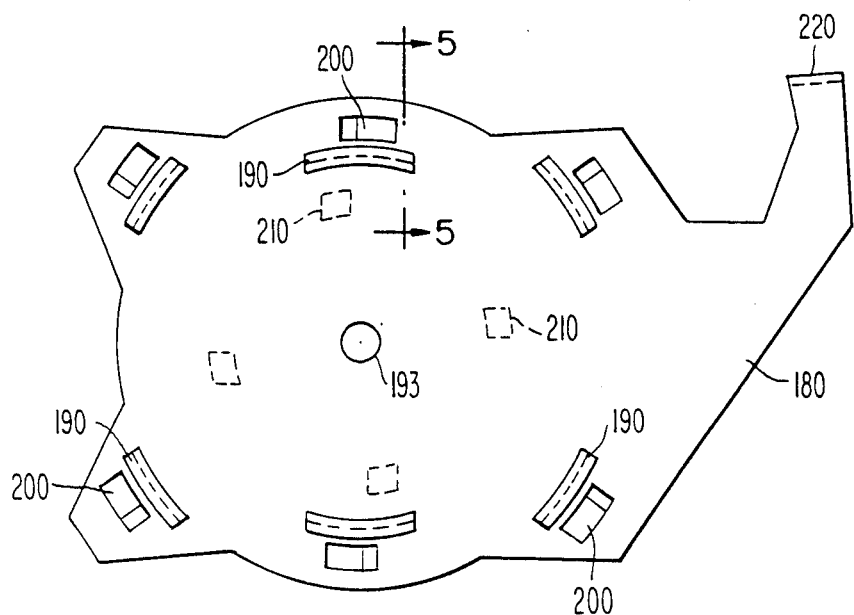
FIG. 3 is a rear view of the coupling plate for coupling together the separated modules of FIG. 1 seen in FIG. 2.
Figure 8:
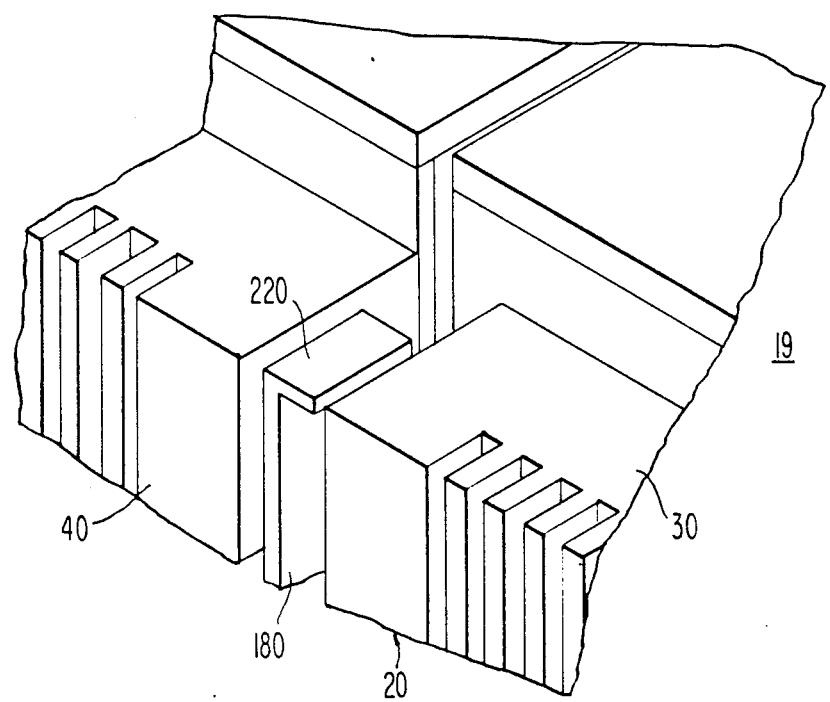
FIG. 8 is a perspective view of the modules of FIG. 2 coupled together.

In operation of the invention, first, the coupling plate 180 is rotatably coupled to the plate 60 with the retention tabs 190 in the apertures 150. Next, the two assemblies 20 and 40 are positioned facing each other with the plate 180 rotated clockwise, in which position the locking ramps 200 are generally aligned with the apertures 110, and the wedges 210 are aligned with the apertures 120 in plate 50. The two assemblies 20, 40 are brought together and manipulated so that the locking ramps 200 enter their associated apertures 110 in plate 50, and the wedges 210 enter apertures 120, and the plate 180 is rotated counterclockwise, as seen in FIG. 2 (downwardly as seen in FIG. 8) to cause the locking ramps 200 to tightly engage the plate 50 and to lock the two assemblies 20, 40 together. With the parts locked together, the handle 220 is near the bases of the assemblies 20, 40.

To disconnect the assemblies 20, 40, the handle 220 is pushed upwardly and the assemblies 20, 40 are manipulated to disengage assembly 20 from the coupling plate 180 which remains secured to plate 60. It is noted that, as the handle 220 is pushed upwardly and the coupling plate 180 rotates with respect to the plate 50, the wedges 210 come out of the apertures 120 in plate 50 and push against the solid portion of plate 50 and assist the separation process.

What is claimed is:

1. A coupling arrangement comprising:
   a first assembly having a first end wall, portions of said first wall being formed with first and second pluralities of apertures therein;
   a second assembly having a second end wall;
   manually actuable means pivotally mounted to said second wall, for engaging said first plurality of apertures and drawing said first and second walls towards each other after having brought said manually actuable means into an interfitting relation with said first plurality of apertures and thereafter having rotated said manually actuable means in a first direction from a first position to a second position; and
   wherein said manually actuable means further includes ejection means for assisting a separation of first and second walls upon a subsequent rotation of said manually actuable means in a second direction from said second position to said first position.

2. The coupling arrangement according to claim 1 wherein said manually actuable means includes a coupling plate having front and rear surfaces, the rear surface facing said second wall, said ejection means including a plurality of ejection wedges carried on said front surface of said coupling plate, said second plurality of apertures sized and positioned to accommodate said plurality of ejection wedges as said manually actuable means is rotated from said first position to said second position.

3. The coupling arrangement according to claim 2 wherein said manually actuable means further includes a plurality of locking ramp members carried on said front surface, said first plurality of apertures sized and positioned to accommodate said plurality of locking ramp members when said manually actuable means is in said first position and brought into said interfitting relation with said first plurality of apertures.

4. The coupling arrangement according to claim 3 wherein:
portions of said second wall are formed with a third plurality of apertures therein;
a plurality of retention tabs are carried on said rear surface of said coupling plate, said third plurality of apertures sized and positioned to accommodate said plurality of retention tabs regardless of the position of rotation of said manually actuable means; and
wherein each of said retention tabs frictionally engages said second wall when said manually actuable means is in said second position.

5. The coupling arrangement according to claim 4 wherein said first and second pluralities of apertures are arranged in first and second circular arrays respectively, the centers of said first and second circular arrays coincident with said pivotal mount.

6. The coupling arrangement according to claim 5 wherein said coupling plate is captively connected to said second wall by a pivot.

7. A coupling arrangement comprising
a first assembly;
a first plate, having a first and a second plurality of apertures therethrough, forming a wall of said first assembly;
a second assembly;
a second plate forming a wall of said second assembly;
a third plate having front and rear surfaces and pivotally coupled to said second plate;
first locking tabs on the front surface of said third plate for rotatably securing said third plate to said first plate whereby said first and second assemblies are coupled together, the coupling being performed by first aligning said third plate and said first plate with said first locking tabs in the first plurality of apertures in said first plate and then rotating said third plate in a first direction to lock said first locking tabs in the first plurality of apertures in said first plate; and
wherein said third plate also includes, on its front surface, a plurality of wedge-shaped members which are positioned in the second plurality of apertures in said first plate when said first and second assemblies are coupled together and which bear against said first plate when said third plate is rotated in the opposite direction during the process in which said first and second assemblies are separated from each other, said wedge-shaped members thus assisting the separation operation.

8. The coupling arrangement defined in claim 7 wherein said third plate includes, on said rear surface, second locking tabs which slidably engage said second plate.

9. In a system having first and second assemblies having cooperating pin and socket connector portions disposed along respective first and second walls, an improved coupling mechanism for effecting engagement of said pin and socket connector portions, comprising:
portions of said first wall being formed with a first and a second plurality of apertures therein; and
manually actuable means, pivotally mounted to said second wall, for engaging said first plurality of apertures and drawing said first and second walls towards each other after having brought said manually actuable means into an interfitting relation with said first plurality of apertures and thereafter having rotated said manually actuable means in a first direction from a first position to a second position, thereby affecting the engagement of said pin and socket connector portions, said manually actuable means including a coupling plate having front and rear surfaces, the rear surface facing said second wall, a plurality of locking ramp members and a plurality of ejection wedges carried on said front surface of said coupling plate.

10. The system according to claim 9 wherein said manually actuable means is always captively mounted to said second wall.

11. The system according to claim 9 wherein:
portions of said second wall are formed with a third plurality of apertures therein; and
a plurality of retention tabs are carried on said rear surface of said coupling plate.

12. The system according to claim 11 wherein:
each one of said third plurality of apertures is sized and positioned to accommodate one of said plurality of retention tabs regardless of the position of rotation of said manually actuable means, and wherein each one of said retention tabs always passes through one of said third plurality of apertures.

13. The system according to claim 12 wherein each of said third plurality of apertures comprises a curved opening including a first portion of a first width and a second adjoining portion of a second width, the first width being greater than the second width, each of said retention tabs passing through said first portion without contacting said second wall when said manually actuable means is in said first position, each of said retention tabs frictionally engaging said second wall when said manually actuable means is in said second position.

14. The system according to claim 9 wherein:
said first plurality of apertures are arranged in a first circular array, the center of said first circular array coincident with the pivotal mount;
said second plurality of apertures are arranged in a second circular array, the center of said second circular array coincident with the pivotal mount.

15. The system according to claim 14 wherein said second circular array is within said first circular array.

16. The system according to claim 14 wherein said first and second plurality of apertures are sized and positioned to accommodate said plurality of locking ramp members and said plurality of ejection wedges respectively when said manually actuable means is in said second position.

17. The system according to claim 14 wherein each of said first plurality of apertures is a curved opening and wherein each of said locking ramp members includes a spacer portion extending perpendicularly from said front surface, a first locking member portion extending from the distal end of said spacer portion parallel to said coupling plate and an end portion extending from the distal end of said first locking member portion, the end portion tapering outwardly away from said coupling plate.

18. The system according to claim 9 wherein each of said ejection wedges is a right triangular wedge, the base of said right triangular wedge position on said front surface, each of said ejection wedges positioned to enter one of said second plurality of apertures as said manually actuable means is rotated from said first position to said second position.

19. The system according to claim 9 wherein said coupling plate is connected to said second wall by a pivot for rotation about an axis perpendicular to said second wall.

20. The system according to claim 9 wherein said coupling plate includes a generally tangentially extending handle and wherein said handle is in a generally vertical upwardly directed orientation when said manually actuable means is in said first position.

21. In a system having first and second assemblies having cooperating pin and socket connector portions disposed along respective first and second walls, an improved coupling mechanism for effecting engagement of said pin and socket connector portions, comprising:

portions of said first wall being formed with a first and a second plurality of apertures therein; and manually actuable means, pivotally mounted to said second wall, for engaging said first plurality of apertures and drawing said first and second walls towards each other after having brought said manually actuable means into an interfitting relation with said first plurality of apertures and thereafter having rotated said manually actuable means in a first direction from a first position to a second position, thereby effecting the engagement of said pin and socket connector portions, wherein said manually actuable means further includes ejection means, cooperating with said second plurality of apertures, for assisting a separation of said first and second assemblies as said manually actuable means is rotated in a second direction from the second position to the first position subsequent to having brought said manually actuable means into said interfitting relation with said first plurality of apertures and having rotated said manually actuable means to the second position.

22. The system according to claim 21 wherein said manually actuable means includes a coupling plate having front and rear surfaces, the rear surface facing said second wall, said ejection means including a plurality of ejection wedges on the front surface, each of said ejection wedges positioned to enter one of said second plurality of apertures as said manually actuable means is rotated from said first position to said second position.

23. The system according to claim 22 wherein a plurality of locking ramp members are carried on said front surface, said first plurality of apertures sized and positioned to accommodate said plurality of locking ramp members when said manually actuable means is in said first position and brought into said interfitting relation with said first plurality of apertures.

* * * * *